(12) United States Patent
Akamine et al.

(10) Patent No.: US 6,658,243 B2
(45) Date of Patent: *Dec. 2, 2003

(54) HIGH FREQUENCY POWER AMPLIFYING APPARATUS HAVING AMPLIFYING STAGES WITH GAIN CONTROL SIGNALS OF LOWER AMPLITUDES APPLIED TO EARLIER PRECEDING STAGES

(75) Inventors: Hitoshi Akamine, Maebashi (JP); Nobuhiko Ishihara, Kawasaki (JP); Tetsuaki Adachi, Tobu (JP); Yasuhiro Nunogawa, Takasaki (JP); Kogi Sugita, Yokohama (JP)

(73) Assignees: Hitachi, Ltd., Tokyo (JP); Hitachi Tohbu Semiconductor, Ltd., Gunma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/199,319

(22) Filed: Jul. 22, 2002

(65) Prior Publication Data

US 2002/0183029 A1 Dec. 5, 2002

Related U.S. Application Data

(63) Continuation of application No. 09/550,903, filed on Apr. 17, 2000.

(30) Foreign Application Priority Data

Apr. 21, 1999 (JP) ............................. 11-113120

(51) Int. Cl.[7] ................................. H04B 7/00
(52) U.S. Cl. ............................... 455/253.2; 455/253.1; 455/259
(58) Field of Search ............................ 455/253.2, 240.1, 455/245.2, 251.1, 259, 262, 264, 341

(56) References Cited

U.S. PATENT DOCUMENTS

| | | | |
|---|---|---|---|
| 5,689,814 A | 11/1997 | Hagisawa et al. | 455/226.2 |
| 6,118,989 A | 9/2000 | Abe et al. | 455/127 |
| 6,127,716 A | 10/2000 | Morizuka et al. | 257/503 |
| 6,330,165 B1 | 12/2001 | Kohjiro et al. | 361/760 |

FOREIGN PATENT DOCUMENTS

| | | |
|---|---|---|
| JP | 11-186921 | 7/1999 |
| JP | WO99/29037 | 10/1999 |

OTHER PUBLICATIONS

Japanese Journal "The Hitachi Hyoron", vol. 80, No. 11, 1988, pp. 47–52.

*Primary Examiner*—Edward F. Urban
*Assistant Examiner*—Thuan T. Nguyen
(74) *Attorney, Agent, or Firm*—Mattingly, Stanger & Malur, P.C.

(57) ABSTRACT

A high frequency power amplifying apparatus is provided with an amplifying section with a plurality of amplifying stages connected in cascade. A power control signal is supplied to the amplifying section through a control terminal so as to control the output of the high frequency power amplifying apparatus. Each of the amplifying stages has a gain smaller than that of a preceding stage. Gain control signals generated from the power control signal are supplied to the respective amplifying stages. Dividing resistors are connected in series with one another between the control terminal and a reference potential so as to divide the voltage of the power control signal to thereby generate a plurality of different gain control signals. Different ones of the gain control signals are supplied to the respective amplifying stages, an absolute value of a voltage of the gain control signal applied to each stage is smaller than that applied to an earlier preceding stage.

5 Claims, 9 Drawing Sheets

HIGH FREQUENCY POWER AMPLIFYING APPARATUS HAVING AMPLIFYING STAGES WITH GAIN CONTROL SIGNALS OF LOWER AMPLITUDES APPLIED TO EARLIER PRECEDING STAGES

This is a continuation application of U.S. Ser. No. 09/550,903, filed Apr. 17, 2000.

BACKGROUND OF THE INVENTION

The present invention relates to a high frequency power amplifying apparatus for a multi-band communication system or a multi-mode communication system, and a radio communication apparatus in which the high frequency power amplifying apparatus is incorporated. Particularly the invention relates to a technique which is effective in applications to a high frequency power amplifying apparatus (high frequency power amplifying module: PA module) with a plurality of amplifying sections, such as one for a dual-band communication system, and a radio communication apparatus, such as a mobile communication apparatus, in which the high frequency power amplifying apparatus is incorporated.

A high frequency power amplifier is used in a transmitter portion of a mobile communication apparatus such as a mobile telephone, a portable telephone, or the like.

A dual-band communication system is known as a system which can establish communication between portable telephones (for example, cellular telephones) which are different in communication system. Such a dual-band system is described, for example, in "THE HITACHI HYORON" by Hitachi Hyoron-sha, Vol. 80, No. 11 (1998), pp. 47–52. In the same document, there is description about a dual-band system and a dual-band high frequency power amplifier (RF module: PA module) which are based on GSM (Global System for Mobile Communications) having a carrier frequency band in a range of from 880 MHz to 915 MHz and DCS-1800 (Digital Cellular System 1800) having a carrier frequency band in a range of from 1,710 MHz to 1,785 MHz. The document also discloses a triple-mode system as a composite apparatus.

On the other hand, JP-A-11-186921 (published on Jul. 9, 1999) discloses a multi-band mobile communication apparatus which is available for portable telephone systems such as PCN (Personal Communications Network: DCS-1800), PCS (Personal Communications Service: DCS-1900), GSM, and so on.

A dual-band high frequency power amplifying module is configured to have two amplifying sections (high frequency power amplifying sections) each constituted by two or more transistors (amplifiers) connected in cascade sequentially.

In the background art, in order to apply control voltages to transistors in respective stages independently of one another, a general high frequency power amplifying apparatus (RF power amplifier module) divides the voltage of a power control signal Vapc by resistors to thereby supply desired gate biases to the transistors.

Such a configuration has an advantage that gate biases to the transistors in the respective stages can be established independently of one another. However, an electric current also flows into the gates of the respective transistors. Accordingly, when such a configuration is applied to a dual or more RF power amplifier having two amplifying sections, a power control current Iapc becomes unable to satisfy the current consumption specification.

If the resistance of a control voltage supply circuit is to be increased to solve the above-mentioned problem, the CR time constant defined by the resistance and the gate-to-drain parasitic capacitance of a MOS transistor is increased. As a result, a request to the transistor for the switching rate cannot be performed satisfactorily.

SUMMARY OF THE INVENTION

It is an object of the present invention to provide a high frequency power amplifying apparatus with a plurality of amplifying sections in which biases of transistors in the respective amplifying sections can be set to be proper enough to attain high linearity.

It is another object of the present invention to provide a high frequency power amplifying apparatus with a plurality of amplifying sections, which is superior in switching characteristic.

It is a further object of the present invention to provide a high frequency power amplifying apparatus with a plurality of amplifying sections, in which only one switching terminal is provide and which is convenient to use.

It is a still further object of the present invention to provide a high frequency power amplifying apparatus with a plurality of amplifying sections, which can achieve reduction of the power consumption.

It is another object of the present invention to provide a radio communication apparatus for a multi-band communication system or a multi-mode communication system, which is superior in performance and which can reduce the power consumption.

In a high frequency power amplifying apparatus with amplifying sections each having a plurality of amplifying stages connected in cascade, a power control signal is supplied to the amplifying sections through a control terminal so as to control the output of the high frequency power amplifying apparatus. According to an aspect of the present invention, in the light of the fact that the respective amplifying stages in the amplifying sections are usually formed in the same manufacturing process with a result that earlier preceding amplifying stages have larger gain, dividing resistors are connected in series with each other between the control terminal and a reference potential to divide the voltage of the power control signal so as to generate a plurality of different gain control signals. Each amplifying stage is supplied with one of the gain control signals thus generated. The voltage of the gain control signal supplied to an amplifying stage has a smaller absolute value than that of the gain control signal supplied to an earlier preceding stage.

According to another aspect of the present invention, there is provided a high frequency power amplifying apparatus comprising:

a plurality of amplifying stages including at least first and final stages, each of the plurality of amplifying stages having a first terminal for receiving an input signal to the stage, a second terminal for sending out an output signal of the stage, and a third terminal for receiving a reference potential for the stage, the first terminal of the first stage being adapted to receive a high frequency input signal to the high frequency power amplifying apparatus, the second terminal of the final stage being adapted to send out a high frequency output signal of the high frequency power amplifying apparatus, the second terminal of each amplifying stage except the final stage being electrically connected to the first terminal of a stage succeeding thereto, each of the amplifying stages except said first stage having a gain smaller than that of a stage preceding thereto;

a control terminal for receiving a power control signal; and a plurality of dividing resistors connected in series with one another between the control terminal and a reference potential for dividing a voltage of the power control signal to thereby generate a plurality of different gain control signals, different ones of the plurality of gain control signals being supplied to different ones of the first terminals of the plurality of amplifying stages respectively, an absolute value of a voltage of the gain control signal applied to the first terminal of each stage being smaller than that of the gain control signal applied to the first terminal of an earlier preceding stage.

According to another aspect of the present invention, there is provided a high frequency power amplifying apparatus comprising:

a first amplifying section having a plurality of amplifying stages each including at least first and final stages, each of the plurality of amplifying stages having a first terminal for receiving an input signal to the stage and a bias signal for the stage, a second terminal for sending out an output signal of the stage and a third terminal for receiving a reference potential for the stage, the first terminal of the first stage being adapted to receive a first high frequency input signal to the high frequency power amplifying apparatus, the second terminal of the final stage being adapted to send out a first high frequency output signal of the high frequency power amplifying apparatus, the second terminal of each amplifying stage except the final stage being electrically connected to the first terminal of a stage succeeding thereto, each of the amplifying stages except the first stage having a gain smaller than that of a stage preceding thereto;

a second amplifying section having a plurality of amplifying stages each including at least first and final stages, each of the plurality of amplifying stages having a first terminal for receiving an input signal to the stage and a bias signal for the stage, a second terminal for sending out an output signal of the stage and a third terminal for receiving a reference potential for the stage, the first terminal of the first stage being adapted to receive a second high frequency input signal to the high frequency power amplifying apparatus, the second terminal of the final stage being adapted to send out a second high frequency output signal of the high frequency power amplifying apparatus, the second terminal of each amplifying stage except the final stage being electrically connected to the first terminal of a stage succeeding thereto, each of the amplifying stages except the first stage having a gain smaller than that of a stage preceding thereto;

a control terminal for receiving a power control signal;

a first series of dividing resistors connected in series with one another between the control terminal and a reference potential for dividing a voltage of the power control signal to thereby generate a plurality of different first gain control signals, different ones of the plurality of first gain control signals being supplied as the bias signals to the respective first terminals of the plurality of amplifying stages in the first amplifying section, an absolute value of a voltage of the first gain control signal applied to the first terminal of each stage being smaller than that of the first gain control signal applied to the first terminal of an earlier preceding stage;

a second series of dividing resistors connected in series with one another between the control terminal and the reference potential for dividing a voltage of the power control signal to thereby generate a plurality of different second gain control signals, different ones of the plurality of second gain control signals being supplied as the bias signal to the respective first terminals of the plurality of amplifying stages in the second amplifying section, an absolute value of a voltage of the second gain control signal applied to the first terminal of each stage being smaller than that of the second gain control signal applied to the first terminal of an earlier preceding stage;

a selection circuit connected to the first and second series of series-connected resistors, said selection circuit being responsive to an amplifying-section selection signal to cause the power control signal to be supplied to one of the first series of series-connected resistors and the second series of series-connected resistors and cause the power control signal to be blocked from being supplied to the other of the first and second series of series-connected resistors in order to make one of the first and second amplifying sections active and make the other inactive.

DETAILED DESCRIPTION OF THE EMBODIMENTS OF THE INVENTION

For a better understanding of the present invention, first, description will be made about a high frequency power amplifying apparatus which has been devised and examined by the inventors of the present application. Therefore, the structure shown in FIG. 1 does not belong to known technology as long as the inventors of the present application know.

Figure 1:
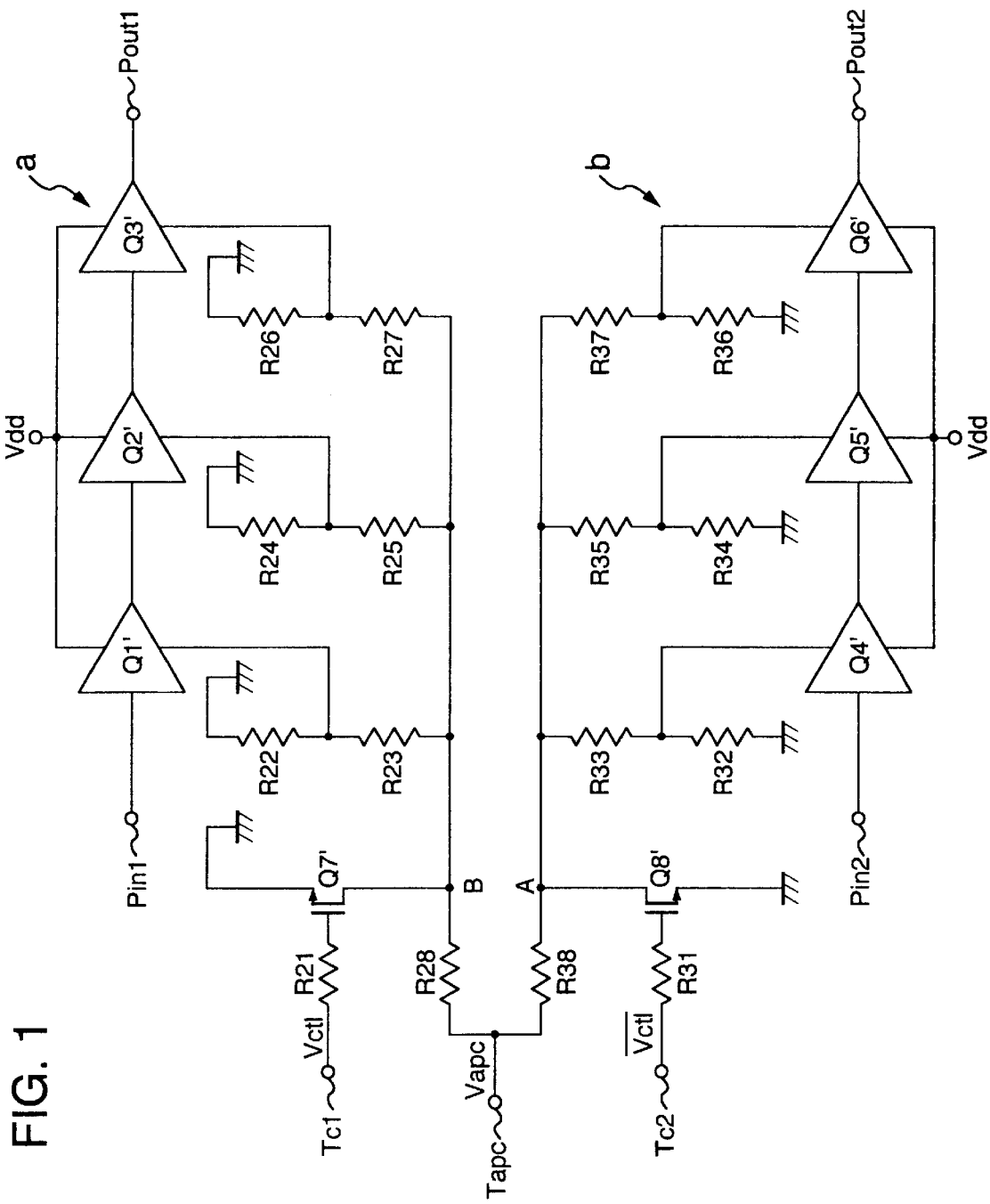
FIG. 1 is an equivalent circuit diagram showing a dual-band high frequency power amplifying apparatus devised by the present inventors and examined previously to the present invention.
Figure 2:
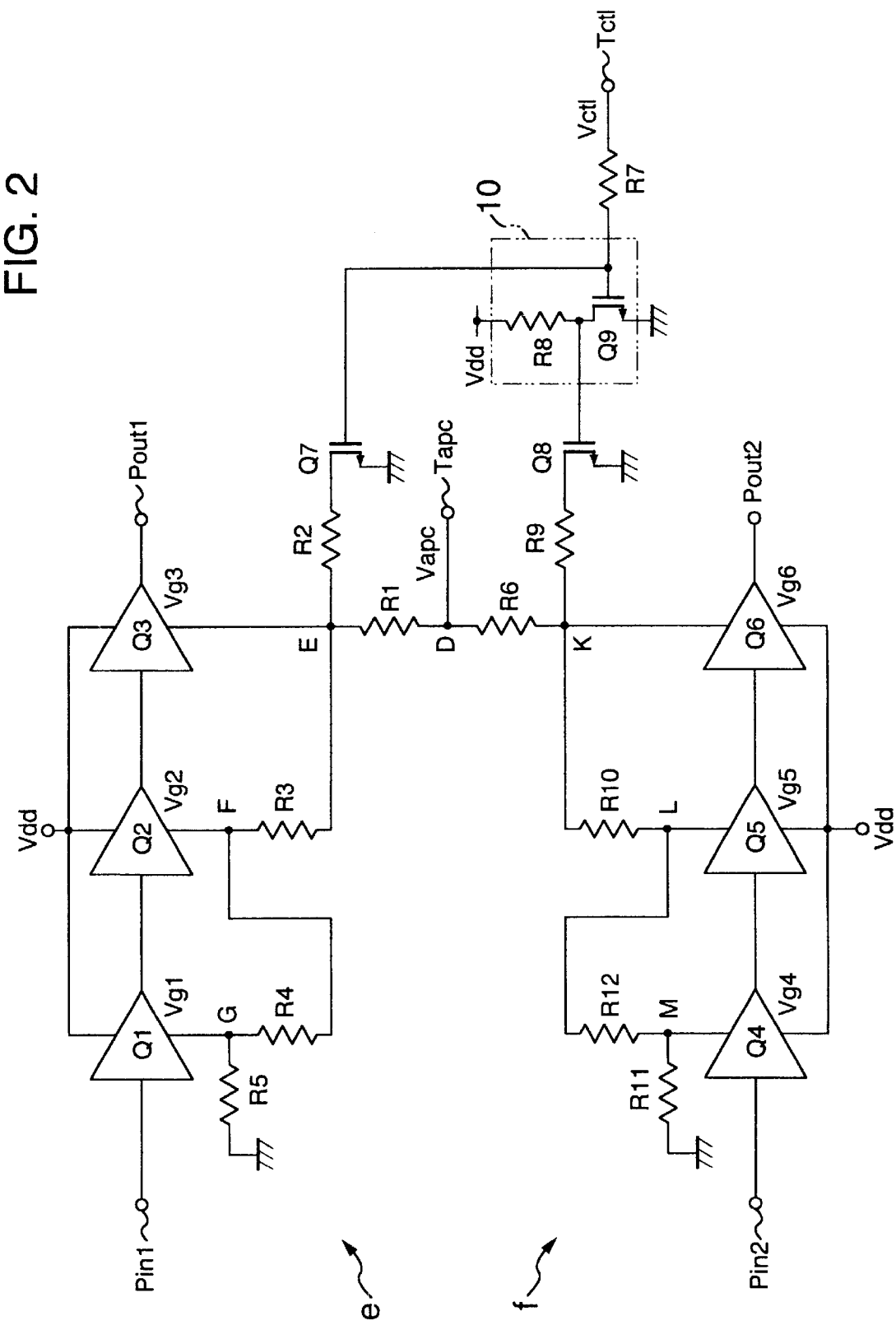
FIG. 2 is an equivalent circuit diagram of a dual-band high frequency power amplifying apparatus according to an embodiment (Embodiment 1) of the present invention.

FIG. 1 is an equivalent circuit view showing a dual-band high frequency power amplifying apparatus examined previous to the present invention, which is arranged so that MOSFETs (Metal Oxide Semiconductor Field-Effect-Transistors) are incorporated in three stages (initial stage (first stage), second stage, and final stage (third stage)) in each amplifying section.

As shown in FIG. 1, the two amplifying sections are constituted by an amplifying section a in which a first-stage transistor circuit Q1', a second-change transistor circuit Q2' and a final-stage transistor circuit Q3' are connected in cascade between an input terminal Pin1 and an output terminal Pout1, and an amplifying section b in which a first-stage transistor circuit Q4', a second-stage transistor circuit Q5' and a final-stage transistor circuit Q6' are connected in cascade between an input terminal Pin2 and an output terminal Pout2.

In the amplifying section a, the gate terminals of the respective transistor circuits Q1', Q2' and Q3' are connected not only to the drain terminal of a switching transistor Q7' through voltage dividing resistors R22 to R27 respectively but also to a control terminal Tapc to which a control voltage Vapc is supplied through a load resistor R28. In addition, the gate terminal of the switching transistor Q7' is connected to a switching terminal Tc1 to which a switching voltage Vct1 is supplied through a gate-impedance matching resistor R21 while the source terminal of the switching transistor Q7' is connected to the ground (GND).

In the amplifying section b, the gate terminals of the respective transistor circuits Q4', Q5' and Q6' are connected not only to the drain terminal of a switching transistor Q8 through voltage dividing resistors R32 to R37 respectively but also to the control terminal Tapc of the power amplifying apparatus through a load resistor R38. In addition, the gate terminal of the switching transistor Q8' is connected to a switching terminal Tc2 to which a switching voltage $\overline{Vct1}$ is supplied through a gate-impedance matching resistor R31 while the source terminal of the switching transistor Q8' is connected to GND.

Further, the drain terminals of the transistor circuits Q1' to Q6' are connected to a power supply terminal Vdd.

To give examples to the resistance values of the resistors, the resistors R28 and R38 take values of 1.8 kΩ; R22, R24, R26, R32, R34 and R36, 2.3 kΩ; and R23, R25, R27, R33, R35 and R37, 300Ω.

In such a high frequency power amplifying apparatus, the switching transistors Q7' and Q8' are actuated alternately on the basis of signals Vct1 and $\overline{Vct1}$ applied to the switching terminals Tc1 and Tc2 so as to use the amplifying section a or b selectively so that power amplification is performed on high frequency signals in different bands.

That is, when the amplifying section a from the input terminal Pin1 to the output terminal Pout1 is actuated, the switching terminals Tc1 and Tc2 are set to be "Low" and "High" respectively. As a result of this setting, a current flows into the respective resistors R21 to R28 in the amplifying section a while a current also flows into the resistor R38 in the amplifying section b.

At this time, the switching transistor Q8' in the amplifying section b operates so that the potential at a node A on the drain side of the switching transistor Q8' becomes close to 0V.

When the amplifying section b operates, on the other hand, a current flows into the respective resistors R31 to R38 in the amplifying section b while a current also flows into the R28 in the amplifying section a in the same manner as in the foregoing case. Then, the potential at a node B on the drain side of the switching transistor Q7' becomes close to 0V.

In order to restrain the current consumption, it is therefore necessary to set the resistors R28 and R38 to be a high resistance value, for example, not less than 2 kΩ.

However, if the resistance value of the resistor R28 is set to be high, the potential at the node B will be low when the amplifying section e is operating. Thus, respective biases cannot be set to take their proper values (for example, bias values required for making the respective amplifying stages active).

If the resistance values of the voltage dividing resistors R22, R24 and R26 are set to be high enough to set the respective biases to take their proper values, a request to the respective stages for the switching rate cannot be then satisfied.

Further, in the circuit arrangement shown in FIG. 1, two switching terminals Tc1 and Tc2 are required. It is troublesome to handle them.

Embodiments of the present invention will be described below in detail with reference to the drawings. Incidentally, in all the drawings for explaining the embodiments of the present invention, the same or corresponding parts are referenced correspondingly, and their description will not be repeated.

Embodiment 1

In Embodiment 1, description will be made about an example in which the present invention is applied to a mobile communication apparatus for a dual-band communication system having two amplifying sections, and a high frequency power amplifying apparatus to be incorporated in the mobile communication apparatus.

FIGS. 2 to 5 are diagrams relating to a dual-band high frequency power amplifying apparatus (RF power amplifier module: or PA module) according to an embodiment (Embodiment 1) of the present invention.

Figure 3:
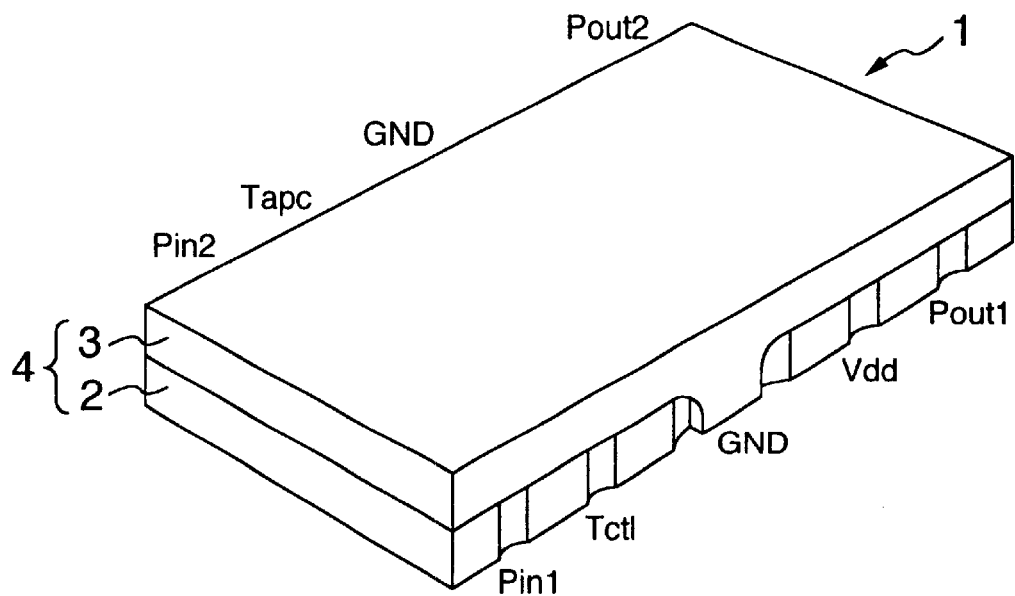
FIG. 3 is a perspective view showing the external appearance of the dual-band high frequency power amplifying apparatus of Embodiment 1.

A dual-band PA module 1 according to Embodiment 1 has a flat rectangular parallelepiped structure as shown in the perspective view of FIG. 3. That is, the dual-band PA module 1 includes a flat rectangular parallelepiped package 4 having a plate-like connection board 2 and a cap 3 provided on this connection board 2 so as to cover one surface (main surface) of the connection board 2.

More specifically, the dual-band PA module 1 has a configuration in which, for example, active parts such as transistors, etc. and passive parts such as chip resistors, chip capacitors, etc. are mounted on the one surface of the connection board 2 having a multi-layer structure, and a plurality of transistors are connected in cascade so as to form two multi-stage amplifying sections.

In Embodiment 1, the high frequency power amplifying apparatus includes first and second amplifying sections. In addition, each of the high frequency power amplifying sections has a three-stage structure (initial stage (first stage), second stage, final stage (third stage)) in which three transistors are connected in cascade. Insulated-gate field-effect transistors, for example, MOSFETs are used as the respective transistors, not by way of limitation.

In addition, the one surface of the connection board 2 is covered with the cap 3 which is made of metal and which plays a role of electromagnetic shielding effect. The cap 3 is electrically connected to a GND terminal of the connection board 2.

Figure 4:
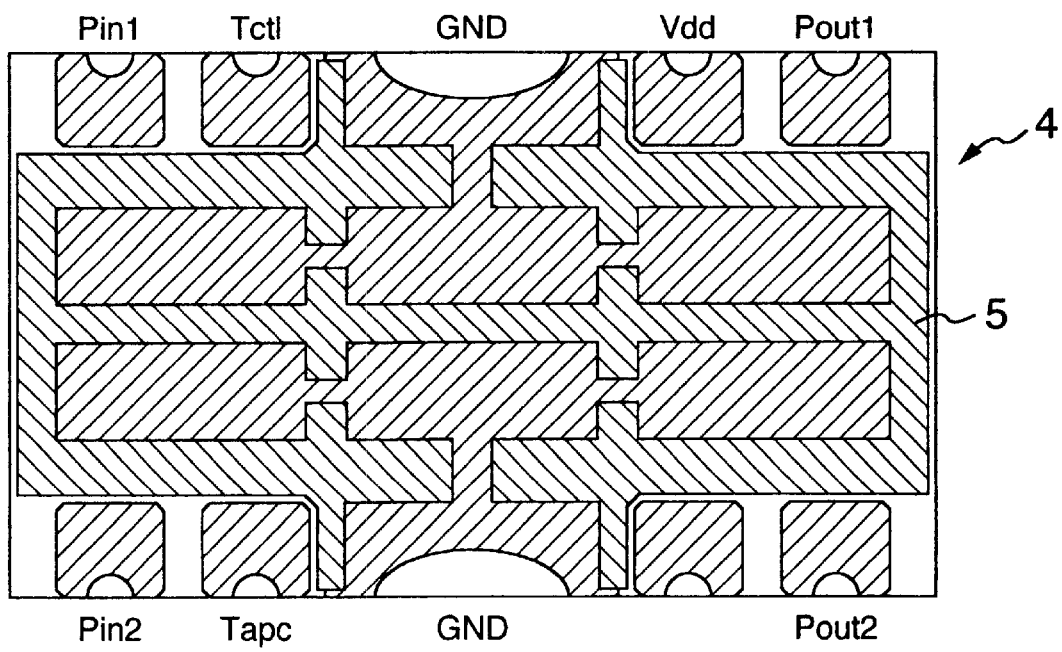
FIG. 4 is a bottom view of the dual-band high frequency power amplifying apparatus of Embodiment 1.

External electrode terminals (electrode terminals) which are electrically independent of the foregoing package 4 project therefrom. That is, in this embodiment, surface-mounting external electrode terminals are provided at the circumferential edge of the lower surface (bottom surface) of the connection board 2 as shown in FIG. 4 which shows the bottom surface of the PA module 1 of FIG. 3.

As the foregoing external electrode terminals, a first-amplifying section input terminal (Pin1); a switching terminal Tct for selectively switching between the first amplifying section and the second amplifying section; a reference potential terminal (for example, ground terminal: GND); a power supply potential terminal (for example, power supply terminal: Vdd); and a first-amplifying section output terminal Pout1 are provided along one edge of the package 4 in the order from the left to the right as shown in FIG. 4. Along the opposite edge of the package 4, a second-amplifying section input terminal (Pin2); a control terminal (Tapc); GND; and a second-amplifying section output terminal (Pout2) are provided in the order from the left to the right. These external electrode terminals are provided over the connection board 2 to extend from its side surfaces to its bottom surface.

Further, the dual-band PA module 1 according to Embodiment 1 has a surface-mounting structure using soldering or the like. In this structure, as shown in FIG. 4, GND conductor is covered with a resist film 5 which is optionally provided so that solders for respective connection areas are made even in thickness on the bottom surface of the connection board 2. Thus, the reliability can be ensured when the dual-band PA module 1 is installed.

FIG. 1 is an equivalent circuit diagram of the dual-band PA module 1 according to Embodiment 1. In Embodiment 1, each of high frequency power amplifying sections e and f of the high frequency power amplifying apparatus has three amplifying stages connected in cascade.

In the first amplifying section e, a first-stage transistor circuit (first amplifying stage) Q1, a second-stage transistor circuit (second amplifying stage) Q2 and a final-stage transistor circuit (final amplifying stage) Q3 are connected in cascade sequentially. Each amplifying stage has a first terminal for receiving an input signal supplied to the stage, a second terminal for sending out an output of the stage, and a third terminal for receiving a reference potential for the stage. The first terminal in the first stage acts as a first input terminal Pin1 for receiving a first input signal to the high frequency power amplifying apparatus. The second terminal in the final stage acts as a first output terminal Pout1 for sending out an output signal amplified by the high frequency power amplifying apparatus. A switching transistor Q7 is provided for controlling the operation of the first amplifying section e.

In the second amplifying section f, a first-stage transistor circuit (first amplifying stage) Q4, a second-stage transistor circuit (second amplifying stage) Q5 and a final-stage transistor circuit (final amplifying stage) Q6 are connected in cascade sequentially. Each amplifying stage has first to third terminals in the same manner as in the first amplifying section e. Thus, the first terminal in the first stage acts as a second input terminal Pin2 for receiving a second input signal supplied to the high frequency power amplifying apparatus. The second terminal in the final stage acts as a second output terminal Pout2 for sending out a second output signal amplified by the high frequency power amplifying apparatus. A switching transistor Q8 is provided for controlling the operation of the second amplifying section f.

One of the first and second amplifying sections e and f is selectively made active on the basis of an amplifying section selection signal Vct1 applied to the switching terminal Tct1, and the other amplifying section is made inactive. An inverter 10 is provided among the switching transistors Q7 and Q8 and the switching terminal Tct1.

The inverter 10 has a transistor Q9 of an MOSFET. The control electrode of the transistor Q9 is connected to the switching terminal Tct1 through a gate bias resistor R7. The control electrode of the switching transistor Q7 of the first amplifying section e is connected to the control electrode of the transistor Q9 so that the gate bias to the switching transistor Q7 is determined also by the resistor R7.

The output electrode of the transistor Q9 is connected to the control electrode of the switching transistor Q8 of the second amplifying section f. Further, the control electrode of the switching transistor Q8 is connected to the power supply potential terminal (power supply terminal: Vdd) through a resistor R8 so that a predetermined gate bias is applied to the transistor Q8. The transistors Q7 and Q8 and the inverter 10 constitute an amplifying section selecting circuit.

The gains of the respective transistor circuits (amplifying stages) in the first and second amplifying sections e and f are controlled by a power control signal Vapc applied to the control terminal Vapc. Then, voltage dividing resistors are provided so that optimum gain control voltages are applied to the transistor circuits respectively, as will be described later.

That is, the conductor is branched into two at a node D connected to the control terminal Tapc. One of the branches feeds the first amplifying section e, and the other feeds the second amplifying section f.

For the first amplifying section e, the node D is connected to the control electrode of the final-stage transistor circuit (final amplifying stage) Q3 through a resistor R1. A node E between the final-stage transistor circuit Q3 and the resistor R1 is connected to the control terminal (first terminal) of the second-change transistor circuit (second amplifying stage) Q2 through a resistor R3. A node F between the second-change transistor circuit Q2 and the resistor R3 is connected to the control electrode of the first-stage transistor circuit (first amplifying stage) Q1 through a resistor R4. A node G between the first-stage transistor Q1 and the resistor R4 is connected to reference potential (for example, ground potential GND) through a resistor R5. As a result, the gate biases to the first-stage, second-stage and final stage transistor circuits Q1 to Q3, that is, gain control signals Vg1 to Vg3 are determined.

For the second amplifying section f, in the same manner as in the first amplifying section e, the node D is connected to the control terminal of the final-stage transistor circuit Q6 through a resistor R6. A node K between the final-stage transistor circuit Q6 and the resistor R6 is connected to the control terminal of the second-stage transistor Q5 through a resistor R10. A node L between the second-stage transistor circuit Q5 and the resistor R10 is connected to the control terminal of the first-stage transistor Q4 through a resistor R12. A node M between the first-stage transistor circuit Q4 and the resistor R12 is connected to the reference potential (for example, GND) through a resistor R11. As a result, the gate biases to the first-stage, second-stage and final stage transistor circuits Q4 to Q6, that is, gain control signals Vg4 to Vg6 are determined.

Further, the other electrodes of the switching transistors Q7 and Q8 and the transistor Q9 are connected to the reference potential GND respectively.

To give examples to the resistance values of the voltage dividing resistors, R1=R6=1.2 kΩ, R2=R9=200Ω, R7=R8= 10 kΩ, R3=R10=300Ω, R4=R12=300Ω, and R5=R11=2 kΩ. Incidentally, the power supply potential (Vdd) is, for example, 3.5V.

Figure 5:
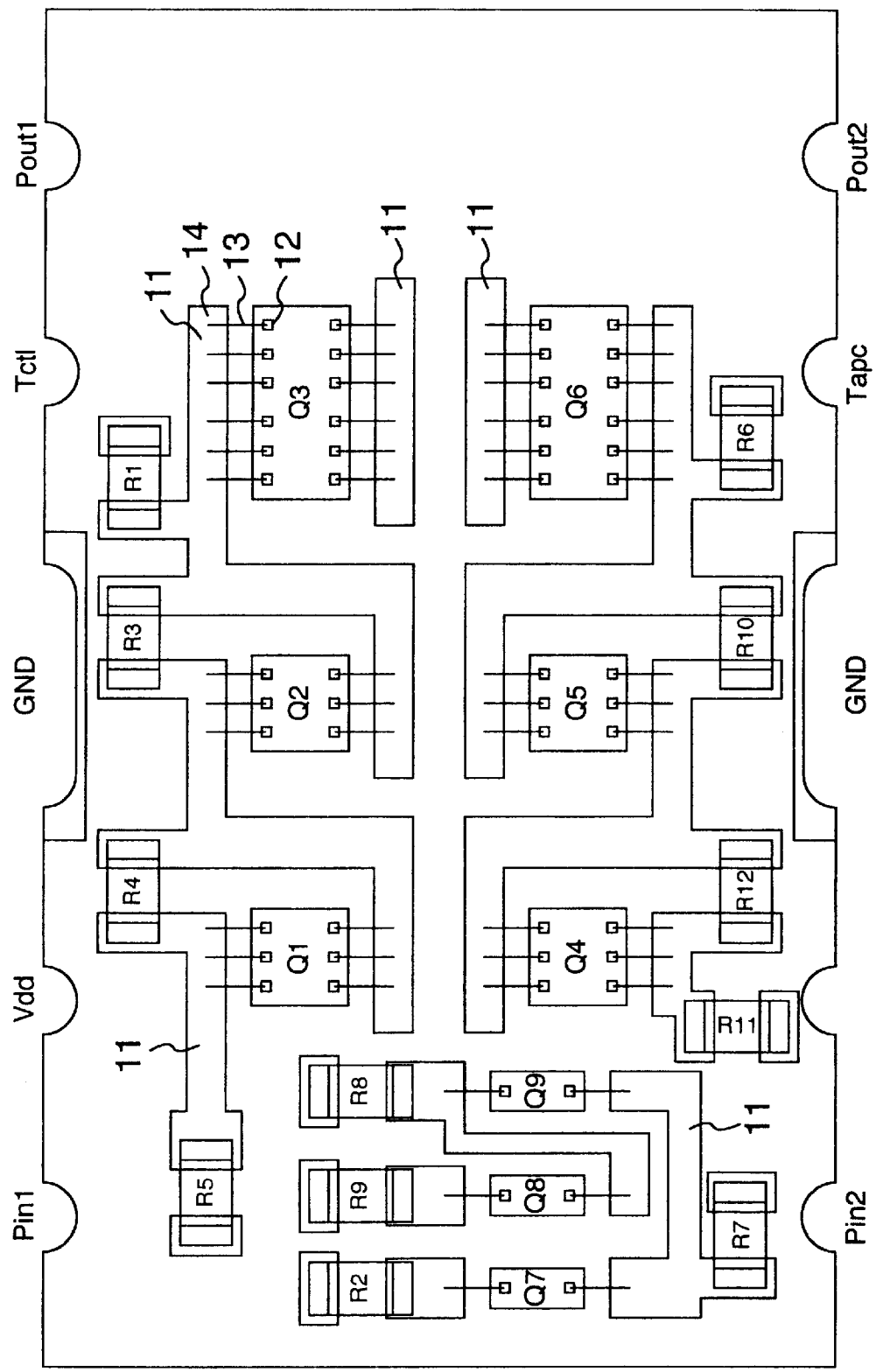
FIG. 5 is a plan view schematically showing the layout of electronic parts on a connection board in the dual-band high frequency power amplifying apparatus of Embodiment 1.

As shown in FIG. 5, the foregoing circuit is generally formed by mounting the respective electronic parts (the above-mentioned transistors and resistors) on the connection board 2. In FIG. 5, conductors 11 are formed in a predetermined pattern on the main surface of the connection board 2. In addition, a wire connection pad 14 is formed by the conductors 11. Then, electrodes 12 of the respective transistors and the wire connection pad 14 are electrically connected to one another through conductors 13.

The dual-band PA module 1 arranged thus has two high frequency power amplifying sections which are actuated by switching.

In Embodiment 1, the first amplifying section e may be used for power amplification of high frequency input signals in GSM (carrier frequency 900 MHz), and the second amplifying section f may be used for power amplification of high frequency input signals in PCN (carrier frequency 1.75 GHz).

Figure 7:
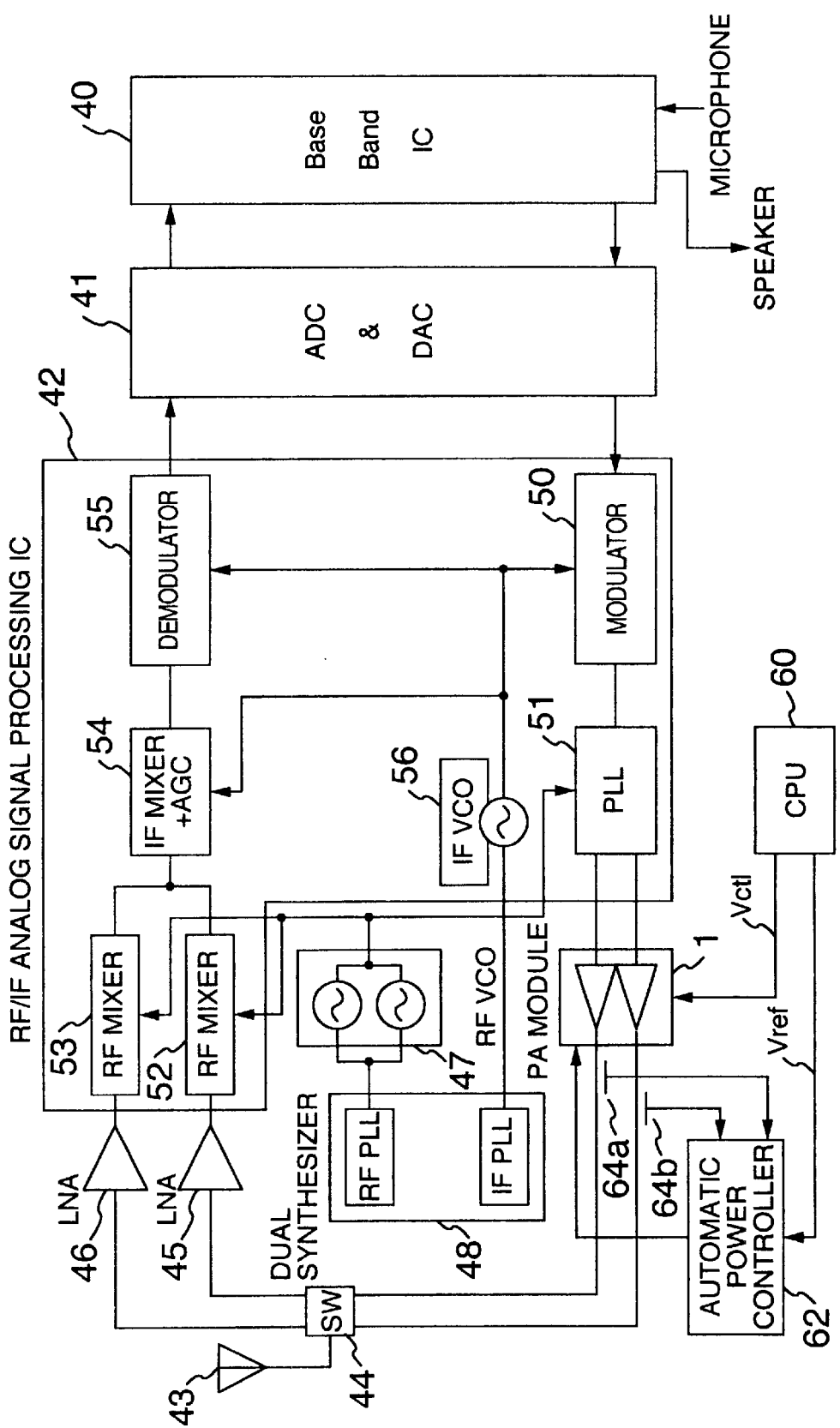
FIG. 7 is a block diagram showing the system configuration of a mobile communication apparatus in which the high frequency power amplifying apparatus of Embodiment 1 is incorporated.

The dual-band PA module 1 of Embodiment 1 is incorporated in a mobile communication apparatus as a radio communication apparatus by way of example. FIG. 7 is a block diagram of a radio portion of a mobile communication apparatus (portable telephone) in which such a dual-band PA module 1 is incorporated.

As shown in FIG. 7, the dual-band portable telephone has a base band portion 40 connected to a microphone or a speaker and including a base band IC; a converter 41 connected to the base band portion 40 and including an along-to-digital converter and a digital-to-analog converter; a signal processing portion 42 connected to the converter 41; an antenna 43; a switch 44 for switching the antenna 43 between transmitting and receiving operations; a dual-band PA module 1 incorporated between the signal processing portion 42 and the switch 44; two low-noise amplifiers (LNAs) 45 and 46 incorporated as two sections between the signal processing portion 42 and the switch 44; an RF VCO (Voltage Controlled Oscillator) 47 connected to the signal processing portion 42; and a dual synthesizer 48 having an RF PLL and an IF PLL connected to the RF VCO 47 and the signal processing portion 42 respectively.

The signal processing portion 42 includes, as a transmitter section, a modulator 50 and a PLL (Phase-Locked Loop) 51 connected thereto. The modulator 50 is connected to the converter 41, and the PLL 51 is connected to the dual-band PA module 1.

In addition, the signal processing portion 42 includes, as a receiver section, two RF mixers 52 and 53 prepared for two frequency bands and respectively connected to the low-noise amplifiers (LNAs) 45 and 46, an IF mixer 54 having an AGC (Auto Gain Control) connected to the RF mixers 52 and 53, and a demodulator 55 connected to the IF mixer 54. The demodulator 55 is connected to the converter 41.

In addition, the dual synthesizer 48 is connected to the IF mixer 54, the modulator 50 and the demodulator 55 through an IF VCO 56 provided in the signal processing portion 42. In addition, the RF VCO 47 is connected to the PLL 51 and the RF mixers 52 and 53.

In the dual-band portable telephone having such a system arrangement, one LNA, one RF mixer, one RF VCO, and one amplifying section of the PA module are selected in accordance with a system (frequency) to be used, and the others are put in a sleep (unuse) mode. Switching them is determined in accordance with the traffic situation in each system automatically or optionally manually.

This switching signal Vct1 is supplied, for example, through a CPU 60. On the other hand, the power control signal Vapc is supplied, for example, from an automatic power controller 62 having a conventionally known configuration. The automatic power controller 62 receives a detection signal indicative of the output of the PA module 1 from either one of couplers 64a and 64b coupled with an output conductor of the PA module 1, and further receives a reference signal Vref corresponding to a predetermined power output from the CPU 60. The automatic power controller 62 compares the detection signal from the coupler with the reference signal so that the power control signal Vapc is determined on the basis of the result of the comparison. The power control signal Vapc determined thus is supplied to the control terminal Tapc of the PA module 1.

According to the dual-band portable telephone of Embodiment 1, dual-band communication can be attained.

Embodiment 1 can obtain at least one of the following effects.

(1) The switching transistors Q7 and Q8 for actuating the respective amplifying sections (the first and second amplifying sections e and f) are configured to select one of the amplifying sections on the basis of a switching signal Vct1 applied, through the switching terminal Tct1, to the control electrode of the transistor Q9 of the inverter 10. As a result, switching terminals are integrated into one, that is, the switching terminal Vct1, so that it is convenient to handle switching.

(2) The respective transistor circuits Q1 to Q6 of the amplifying sections (the first and second amplifying sections e and f) are supplied with suitable gate biases (gain control voltages) so that the bias control is well performed. As a result, not only is it possible to attain the improvement of the linearity in the amplification characteristic of the amplifying sections but also it is possible to lower a control current (Iapc) and hence to reduce the power consumption. In other words, if resistors (for example, R1, R3, R4 and R5) are set to make the biases to the transistors in the respective stages take their optimum values (high linearity), the paths of the control current Iapc are integrated into one so that Iapc can be reduced. To say other words, the resistors (for example, R1, R3, R4 and R5) can be set to be low correspondingly to the reduction of the control current Iapc. Thus, the switching characteristic becomes satisfactory.

(3) In addition, the resistance values of the resistors provided between the control terminal Tapc and the respective transistor circuits Q1 to Q6 can be reduced in accordance with the reduction of the current consumption so that the switching characteristic is improved.

Figure 6:
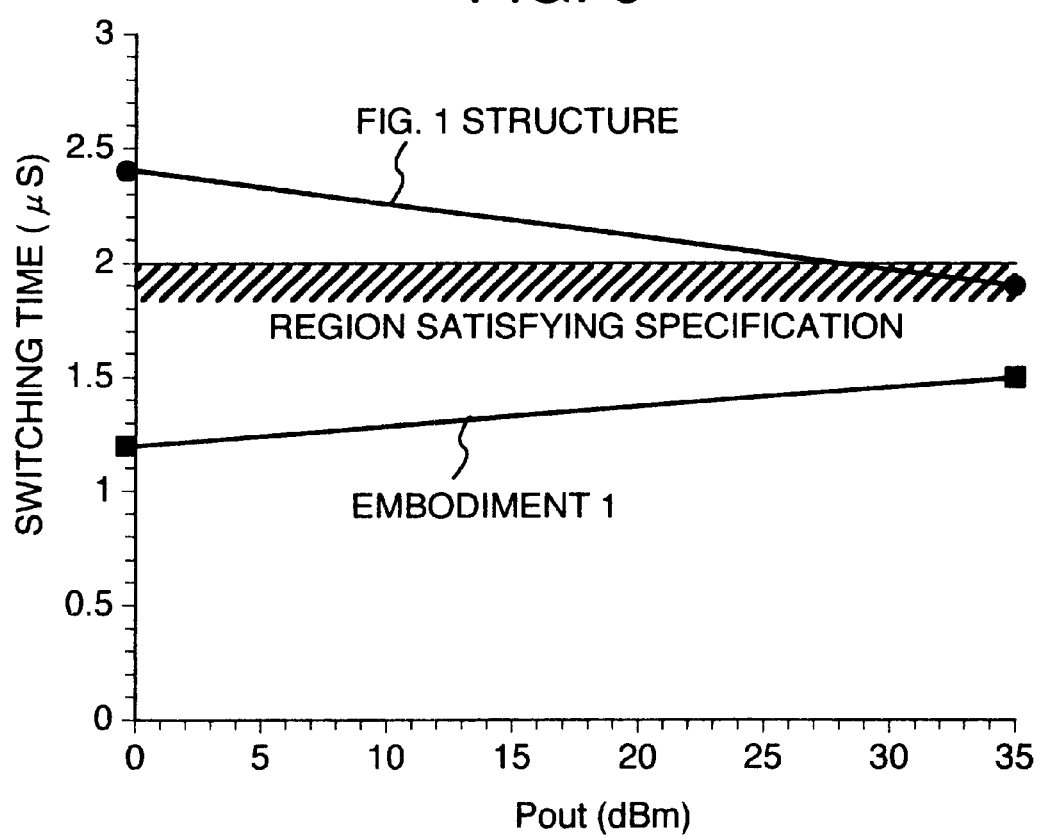
FIG. 6 is a graph showing a correlation between switching time of an amplifying section and an output thereof.

FIG. 6 is a graph showing a correlation between output Pout of the power amplifying apparatus and switching time of the amplifying sections in Embodiment 1. As shown in the same graph, on the assumption that the specification is satisfied when the switching time is 2 μS, it is proved that the switching time takes 2 μS or less till the output Pout reaches 35 dBm, satisfying the specification.

(4) The radio communication apparatus of Embodiment 1 includes a high frequency power amplifying apparatus which is superior in switching performance and in linearity and which can reduce the current consumption. It is therefore possible to provide a multi-band communication system which is superior in performance and which can reduce the power consumption.

Embodiment 2

Figure 8:
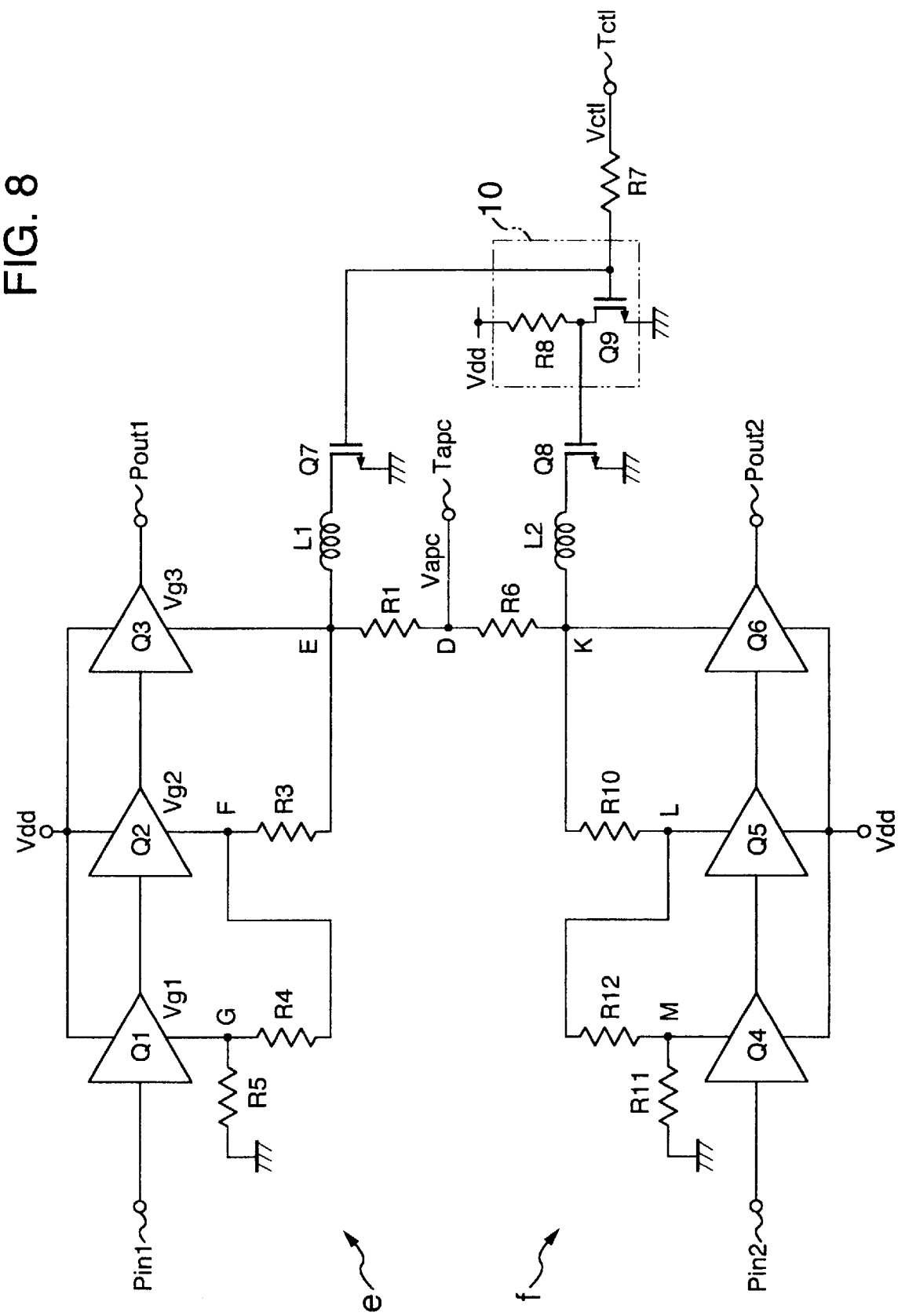
FIG. 8 is an equivalent circuit diagram of a dual-band high frequency power amplifying apparatus according to another embodiment (Embodiment 2) of the present invention.

FIG. 8 is an equivalent circuit diagram of a dual-band high frequency power amplifying apparatus which is another embodiment (Embodiment 2) of the present invention.

The resistors R2 and R9 respectively provided between the switching transistor Q7 of the first amplifying section e and the node E and between the switching transistor Q8 of the second amplifying section f and the node K in Embodiment 1 are replaced by coils L1 and L2 respectively in Embodiment 2.

In any coil, the higher its frequency is, the higher its impedance is. Therefore, when the coils L1 and L2 are disposed between the switching transistor Q7 and the node E and between the switching transistor Q8 and the node K instead of the resistors R2 and R9 respectively, the node E or K can be short-circuited to the drain electrode of the switching transistor Q7 or Q8 as its output electrode with respect to DC while the node can obtain high impedance with respect to the high frequency. Although the specifications of these coils depend on the frequency, for example, coils of 20 nH or more may be used.

For example, when the first amplifying section e from the first input terminal Pin1 to the first output terminal Pout1 is used for GSM (900 MHz) and the second amplifying section f from the second input terminal Pin2 to the second output terminal Pout2 is used for PCN (1.75 GHz), the resistors R2 and R9 cannot take so large resistance values if they are incorporated. As a result, in the PCN operation, a high frequency signal leaks through the resistor R9 so that the efficiency deteriorates. On the other hand, when the coils L1 and L2 are used instead of the resistors R2 and R9 as in the case of Embodiment 2, high-frequency leakage can be restrained so that the efficiency can be prevented from deteriorating.

Figure 9:
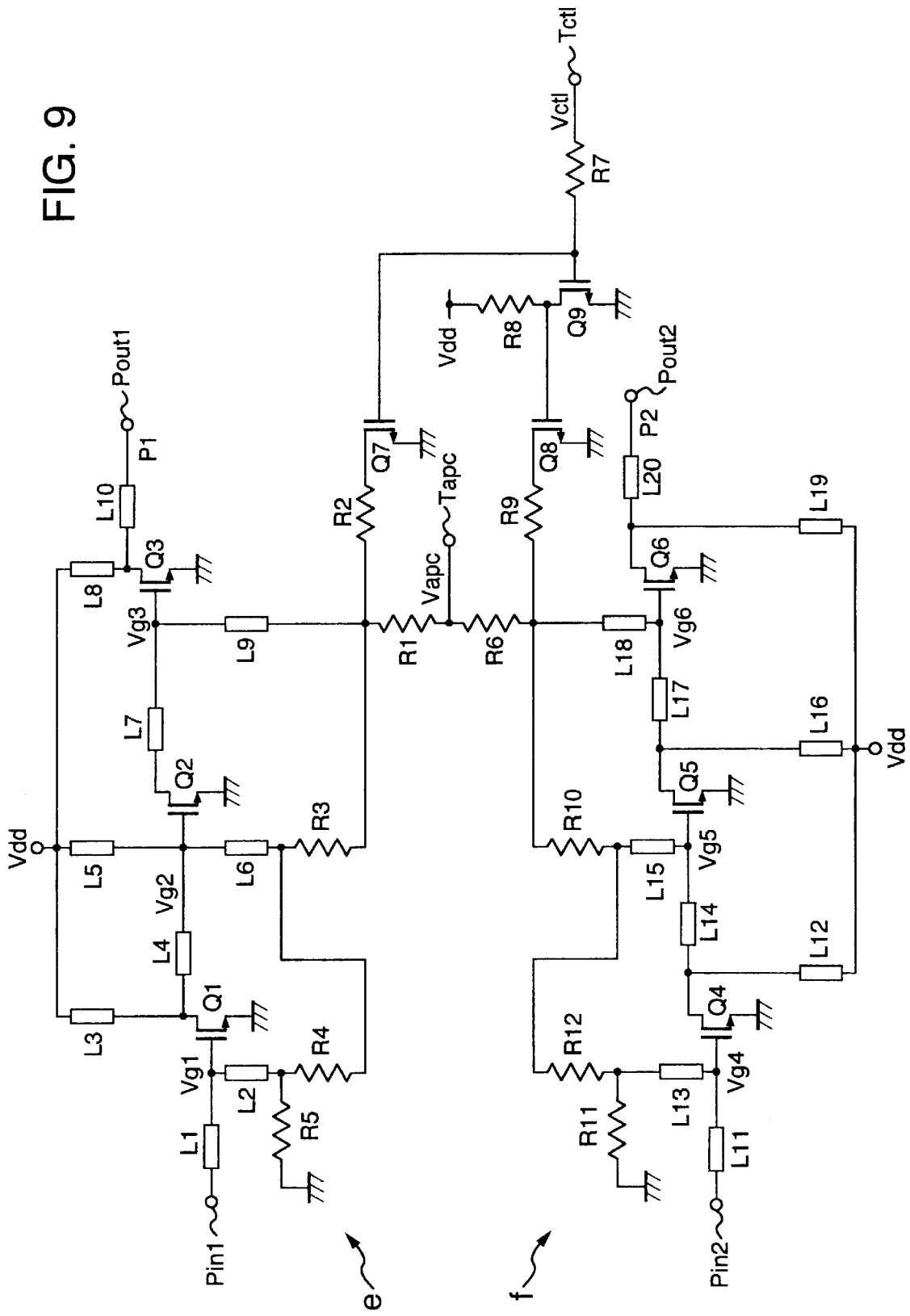
FIG. 9 is a circuit diagram showing the circuit configuration in Embodiment 1 in more detail.
Figure 10:
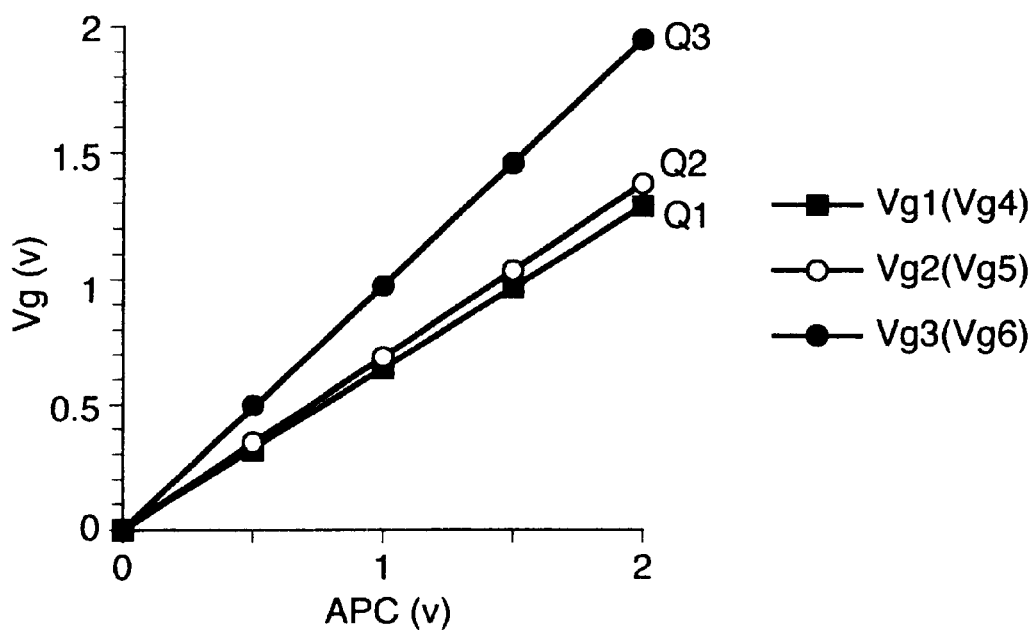
FIG. 10 is a graph useful in explaining the operation of the high frequency power amplifying apparatus shown in FIG. 9.
Figure 11:
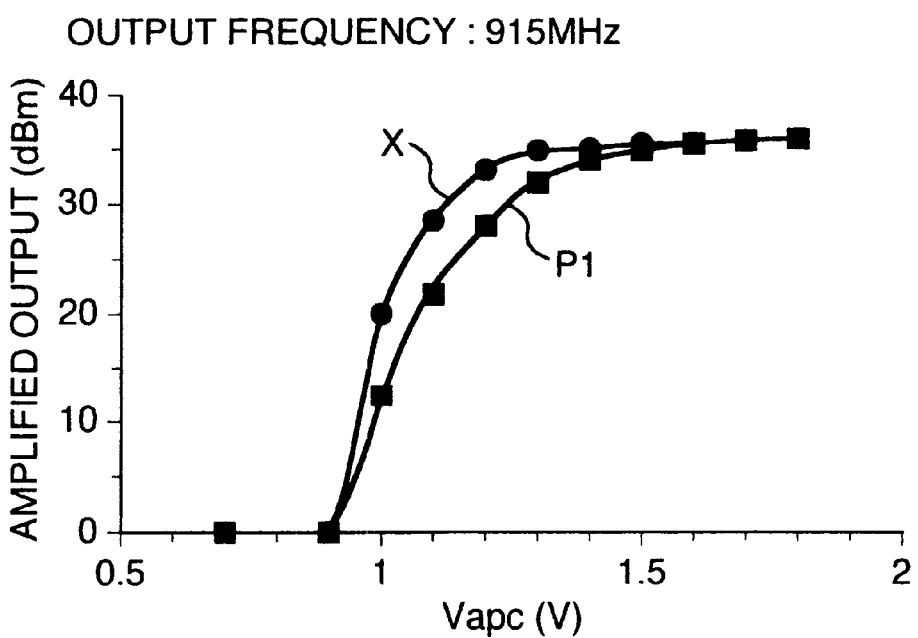
FIG. 11 is a graph showing the output characteristic of the, high frequency power amplifying apparatus shown in FIG. 9.

Next, the embodiment of the present invention will be further described with reference to FIGS. 9 to 11. FIG. 9 shows the circuit arrangement of FIG. 2 in more detail. The reference symbols L1 to L20 represent matching circuits. FIG. 10 is a graph showing changes of gain control signals Vg1, Vg2 and Vg3 applied to the respective amplifying stages with respect to a change of the power control signal Vapc supplied to the control terminal Tapc. FIG. 11 is a graph showing a change of power output of the amplifying section (high frequency power apparatus) with respect to a change of the power control signal Vapc.

In FIG. 9, as the amplifying stage is less preceding, the transistor gate width relative to the transistor gate length is larger. Thus, there is a tendency that as the amplifying stage becomes later, its gain is smaller. If a substantially equal bias voltage, that is, an equal gain control voltage (signal) is applied to the respective amplifying stages in the amplifying section e or f, the leading edge of the power output relative to the power control signal Vapc in the amplifying section e or f becomes sharp as shown by the curve X in FIG. 11. This is inconvenient for varying the power control signal Vapc to thereby control the power output of the high frequency power apparatus accurately.

In the configurations according to the embodiments of the present invention shown in FIGS. 1, 8 and 9, as the amplifying stage of each amplifying section is earlier, the bias voltage (gain control voltage) to be applied to the amplifying stage is made lower as shown in FIG. 10. As a result, the leading edge of the power output relative to the power control signal Vapc becomes gentle as shown by the curve P1 in FIG. 11, so that the property for controlling the power output of the high frequency power amplifying apparatus is improved.

Although the output characteristic of the amplifying section e is shown in FIG. 11, the characteristic of the output P2 of the amplifying section t is also designed so that as the amplifying stage is earlier, the bias voltage (gain control voltage) to be applied to the amplifying stage is made lower as shown in FIG. 10. Thus, the characteristic of the output P2 of the amplifying section f is similar to that which is shown by the curve P1 in FIG. 11.

The invention developed by the inventors of this application has been described specifically on the basis of its embodiments. However, the invention is not limited to the aforementioned embodiments, but it goes without saying that it may be subject to various modifications without departing from its spirit.

Although description was made in the above-mentioned embodiments as to examples in which the present invention was applied to a radio communication apparatus for a multi-band communication system and a high frequency power amplifying apparatus incorporated in the radio communication apparatus, the present invention is similarly applicable to a radio communication apparatus for a multi-mode communication system and a high frequency power amplifying apparatus incorporated in the radio communication apparatus, and then it can have similar effects. In addition, the present invention is similarly applicable to technology with a plurality of amplifying sections different in band and mode, and then it can have similar effects.

The present invention is applicable to any technology so long as it relates to a high frequency power amplifying apparatus with a plurality of amplifying sections.

According to the aforementioned various embodiments, the following effects can be expected.

(1) In a high frequency power amplifying apparatus, switching transistors for actuating respective amplifying sections are configured so that the amplifying sections are selected on the basis of a signal applied through a switching terminal to a control electrode of a transistor of a amplifying section selecting circuit. As a result, if the number of the amplifying sections is two, switching terminals are integrated into one so that it is convenient to handle it.

(2) In the high frequency power amplifying apparatus, the respective transistors of the amplifying sections are supplied with suitable gate biases so that not only is it possible to attain the improvement of the linearity in the amplifying characteristic of the amplifying sections but also it is possible to reduce the current consumption and hence to reduce the power consumption.

(3) In addition, resistance values of resistors provided between the control terminal to which a power control signal is supplied and the respective transistors can be reduced in accordance with the reduction of the current consumption so that the switching characteristic is improved.

(4) In a radio communication apparatus in which the high frequency power amplifying apparatus is incorporated, it is possible to provide a radio communication apparatus for a multi-band communication system which is superior in performance and which can reduce the power consumption.

What is claimed is:

1. A high frequency power amplifying apparatus comprising:
a plurality of amplifying sections each having a plurality of amplifying stages including a first amplifying stage and a second amplifying stage subsequent thereto, in which
said first amplifying stage has a first terminal for receiving an input signal thereto and a second terminal for sending out an output signal depending on the input signal received by the first terminal of the first amplifying stage;

said second amplifying stage has a first terminal for receiving an input signal depending on said output signal from said second terminal of said first amplifying stage and a second terminal for sending out an output signal depending on said input signal received by the first terminal of the second amplifying stage;

a first control terminal for receiving a power control signal; and a control circuit connected to said first control terminal and to said plurality of amplifying sections for controlling, in response to said power control signal, said amplifying stages, so that said second amplifying stage has a gain higher than that of said first amplifying stage.

2. A high frequency power amplifying apparatus according to claim 1, further comprising:

a second control terminal for receiving a switching signal; and a selection circuit connected to said second control terminal and to said control circuit for selectively making one of said plurality of amplifying sections in response to said switching signal received by said second control terminal.

3. A high frequency power amplifying apparatus comprising an amplifying section having a plurality of amplifying stages including a first amplifying stage and a second amplifying stage subsequent thereto, in which said first amplifying stage has a first terminal for receiving an input signal thereto and a second terminal for sending out an output signal depending on the input signal received by the first terminal of the first amplifying stage;

said second amplifying stage has a first terminal for receiving an input signal depending on said output signal from said second terminal of said first amplifying stage and a second terminal for sending out an output signal depending on said input signal received by the first terminal of the second amplifying stage;

a first control terminal for receiving a power control signal; and a control circuit connected to said first control terminal and to said plurality of amplifying stages for controlling, in response to said power control signal, said amplifying stages so that said second amplifying stage has a gain higher than that of said first amplifying stage.

4. A high frequency power amplifying apparatus comprising:

a plurality of amplifying sections each having a plurality of amplifying stages including a first amplifying stage and a second amplifying stage subsequent thereto, in which said first amplifying stage has a first terminal for receiving an input signal thereto and a second terminal for sending out an output signal depending on the input signal received by the first terminal of the first amplifying stage;

said second amplifying stage has a first terminal for receiving an input signal depending on said output signal from said second terminal of said first amplifying stage and a second terminal for sending out an output signal depending on said input signal received by the first terminal of the second amplifying stage;

a first control terminal for receiving a power control signal; and a control circuit connected to said first control terminal and to said plurality of amplifying sections for applying, in response to said power control signal, bias voltages to said first terminals of said first and second amplifying stages, so that a bias voltage at the first terminal of said second amplifying stage is higher than that at the first terminal of said first amplifying stage.

5. A high frequency power amplifying apparatus comprising an amplifying section having a plurality of amplifying stages including a first amplifying stage and a second amplifying stage subsequent thereto, in which said first amplifying stage has a first terminal for receiving an input signal thereto and a second terminal for sending out an output signal depending on the input signal received by the first terminal of the first amplifying stage;

said second amplifying stage has a first terminal for receiving an input signal depending on said output signal from said second terminal of said first amplifying stage and a second terminal for sending out an output signal depending on said input signal received by the first terminal of the second amplifying stage;

a first control terminal for receiving a power control signal; and a control circuit connected to said first control terminal and to said plurality of amplifying stages for applying, in response to said power control signal, bias voltages to said first terminals of said first and second amplifying stage, so that a bias voltage at the first terminal of said second amplifying stage is higher than that at the first terminal of said first amplifying stage.

* * * * *